(12) United States Patent
Ecklund et al.

(10) Patent No.: US 8,154,329 B2
(45) Date of Patent: Apr. 10, 2012

(54) DEVICE AND METHOD FOR PHASE COMPENSATION

(75) Inventors: Lawrence M. Ecklund, Wheaton, IL (US); Robert E. Stengel, Pompano Beach, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 282 days.

(21) Appl. No.: 12/650,649

(22) Filed: Dec. 31, 2009

(65) Prior Publication Data

US 2011/0156781 A1   Jun. 30, 2011

(51) Int. Cl.
   *H03L 7/06* (2006.01)
(52) U.S. Cl. .................................. 327/159; 327/150
(58) Field of Classification Search .............. 327/149, 327/150, 158, 159
   See application file for complete search history.

(56) References Cited

U.S. PATENT DOCUMENTS

| | | | |
|---|---|---|---|
| 6,064,272 A | 5/2000 | Rhee | |
| 6,510,191 B2 | 1/2003 | Bockelman | |
| 6,825,729 B2 * | 11/2004 | Splett | 331/16 |
| 6,941,330 B2 * | 9/2005 | Jackson et al. | 708/270 |
| 6,975,687 B2 * | 12/2005 | Jackson et al. | 375/297 |
| 7,109,766 B2 | 9/2006 | White et al. | |
| 7,250,823 B2 * | 7/2007 | Shields | 331/16 |
| 2006/0268182 A1 * | 11/2006 | Shields | 348/710 |
| 2007/0247245 A1 * | 10/2007 | Hagelin | 331/154 |
| 2011/0156781 A1 * | 6/2011 | Ecklund et al. | 327/159 |
| 2011/0267120 A1 * | 11/2011 | Ravi et al. | 327/159 |
| 2011/0275308 A1 * | 11/2011 | Grobert et al. | 455/1 |

OTHER PUBLICATIONS

Hafez, et al., "A Novel Low Power Phase-Noise PLL Architecture for Wireless Transceivers," Proceedings of the Ninth Great Lakes Symposium on VLSI, 1999, Mar. 4-6, 1999, pp. 306-309.
Wu, et al., "An OPLL-DDS Based Frequency Synthesizer for DCS-1800 Receiver," Proceedings of the 2006 IEEE International Symposium on Circuits and Systems, 2006, 4 pages.
Hu, et al., "A Low Spurious and Small Step Frequency Synthesizer based on PLL-DDS-PLL Architecture," 11th IEEE Singapore International Conference on Communications Systems, 2008, ICCS 2008, Nov. 19-21, 2008, pp. 1471-1474.

* cited by examiner

*Primary Examiner* — Lincoln Donovan
*Assistant Examiner* — Adam Houston

(57) ABSTRACT

A frequency generation unit is provided that permits a receiver to tune from channel to channel without cycle skipping and in which compensation for phase offset introduced during tuning is provided. The frequency generation unit includes a fractional-N synthesizer, a voltage controlled oscillator (VCO), and a direct digital synthesizer (DDS). The fractional-N synthesizer generates frequencies from the VCO as well as a temperature controlled crystal oscillator. Outputs from the fractional-N synthesizer are supplied both the VCO and the DDS to control the VCO and DDS. The combination of the voltage controlled oscillator and fractional-N synthesizer is perpetually locked. The fractional-N synthesizer is maintained in a locked condition. The VCO output is provided to the DDS. An output from the DDS or from the fractional-N synthesizer forms the output signal of the frequency generation unit.

20 Claims, 6 Drawing Sheets

DEVICE AND METHOD FOR PHASE COMPENSATION

FIELD OF THE INVENTION

The present invention relates generally to a device and method for phase compensation. In particular, the invention relates to a frequency generation unit (FGU) having controlled time, phase, or frequency transition over a broad frequency range.

BACKGROUND

For high performance Software Defined Radio (SDR) applications it is often desirable to have a transceiver that operates continuously from 100 MHz to 6 GHz and within Land Mobile Radio (LMR) equipment signal quality performance requirements. This level of signal quality in a transceiver is traditionally achieved using a phase-locked loop (PLL) synthesizer having a narrow bandwidth Fractional-N Phase-Locked Loop (PLL) Synthesizer as a signal source implemented with a Voltage Controlled Oscillator (VCO) using a discrete resonator. The narrow bandwidth Fractional-N PLL synthesizer can provide in excess of −80 dBc of spurious performance and the discrete resonator VCO can provide sideband noise performance of about −126 dBc/Hz at a 25 KHz offset from a 1 GHz carrier. However, the Fractional-N PLL synthesizer typically has a slow slew rate which results in a long transition time of indeterminate phase when changing from one frequency to another.

It would be desirable to have a SDR receiver which is flexible with respect to the frequencies it receives and which has the ability to almost instantaneously (e.g., less than about 1 ms) change from one frequency to the next.

One problem in making such a flexible SDR receiver is that the Fractional-N PLL synthesizer has a complex frequency transition when going from an output signal having a first frequency to an output signal having a second frequency. This includes a duration of time in which the Fractional-N PLL synthesizer generates an output signal having unlocked, non-deterministic signal quality with unknown frequency. A second problem is that the VCO used in the above-described PLL synthesizer often has a limited output frequency range of less than 20% or +/−10% about the frequency of the signal output from the VCO.

Therefore it is desirable to provide a PLL synthesizer which can provide continuous LMR signal quality output to an electronic device, such as a SDR receiver, along with the flexibility to almost instantaneously (e.g., again within about 1 ms) change frequencies across a broad band of frequencies, such as from 100 MHz to 6 GHz. It is also desirable to provide such a PLL synthesizer which uses only one VCO, to lower size and cost of the PLL synthesizer, designed with a discrete resonator which overcomes having any duration of time in which an output signal is generated having unlocked, nondeterministic signal quality and an unknown frequency when the output signal is transitioning from one frequency to a second frequency.

SUMMARY

In one aspect, a frequency generation unit is provided. The frequency generation unit includes a fractional-N synthesizer, a voltage controlled oscillator, a direct digital synthesizer, and a controller. The voltage controlled oscillator generates a reference signal and is connected with the fractional-N synthesizer such that the combination of the voltage controlled oscillator and the fractional-N synthesizer is perpetually locked. The direct digital synthesizer is connected with the fractional-N synthesizer such that an output from the direct digital synthesizer or fractional-N synthesizer forms an output signal of the frequency generation unit. The controller is connected with the fractional-N synthesizer and the direct digital synthesizer. The controller generates a first control signal that indicates to both the fractional-N synthesizer and the direct digital synthesizer of a desired frequency of the output signal.

In another embodiment, a method for generating an output signal is provided. The method comprises sending a first control signal from a fractional-N synthesizer to a voltage controlled oscillator such that the combination of the voltage controlled oscillator and the fractional-N synthesizer is perpetually locked. A reference signal is generated using the voltage controlled oscillator. The first control signal adjusts the frequency of the reference signal, which is received at a direct digital synthesizer. A second control signal is transmitted from the fractional-N synthesizer to the direct digital synthesizer. The fractional-N synthesizer or the direct digital synthesizer generates the output signal.

In another embodiment, a method for changing a frequency of an output signal from a first frequency to a second frequency is provided. The method comprises sending a first control signal from a fractional-N synthesizer to a voltage controlled oscillator such that the combination of the voltage controlled oscillator and the fractional-N synthesizer is perpetually locked. The first control signal adjusts a frequency of a reference signal generated by the voltage controlled oscillator. The output signal is generated at the second frequency from the reference signal using a direct digital synthesizer or the fractional-N synthesizer.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

The present invention makes use of the discovery that by using a frequency generation unit having a direct digital synthesizer (DDS) in combination with a Fractional-N PLL synthesizer, continuous signal quality output can be provided to an electronic device, such as a SDR receiver, along with almost instantaneous frequency changes along a broad band of frequencies, such as from 100 MHz to 6 GHz. Although good signal quality is achieved when the Fractional-N PLL synthesizer is tuned from one frequency to the next, good LMR quality (−80 dBc spurious) is achieved when the Fractional-N PLL synthesizer is not being tuned. Additionally, by using a frequency generation unit with a combined DDS and Fractional-N PLL Synthesizer, a PLL synthesizer may be formed which uses a VCO and which overcomes having any duration of time in which an output signal is generated having nondeterministic signal quality when the output signal is transitioning from one frequency to a second frequency, since the tuning may occur without unlocking the combination of the Fractional-N PLL Synthesizer and VCO. By using the frequency generation unit, the receiver may be tuned without cycle skipping occurring in the Fractional-N PLL synthesizer while compensating for phase offset introduced when the receiver is being tuned.

In the description that follows, the subject matter of the application will be described with reference to acts and symbolic representations of operations that are performed by one or more electronic devices, unless indicated otherwise. However, although the subject matter of the application is being described in the foregoing context, it is not meant to be limiting as those skilled in the art will appreciate that some of the acts and operations described hereinafter can also be implemented in hardware, software, and/or firmware and/or some combination thereof.

Figure 1:
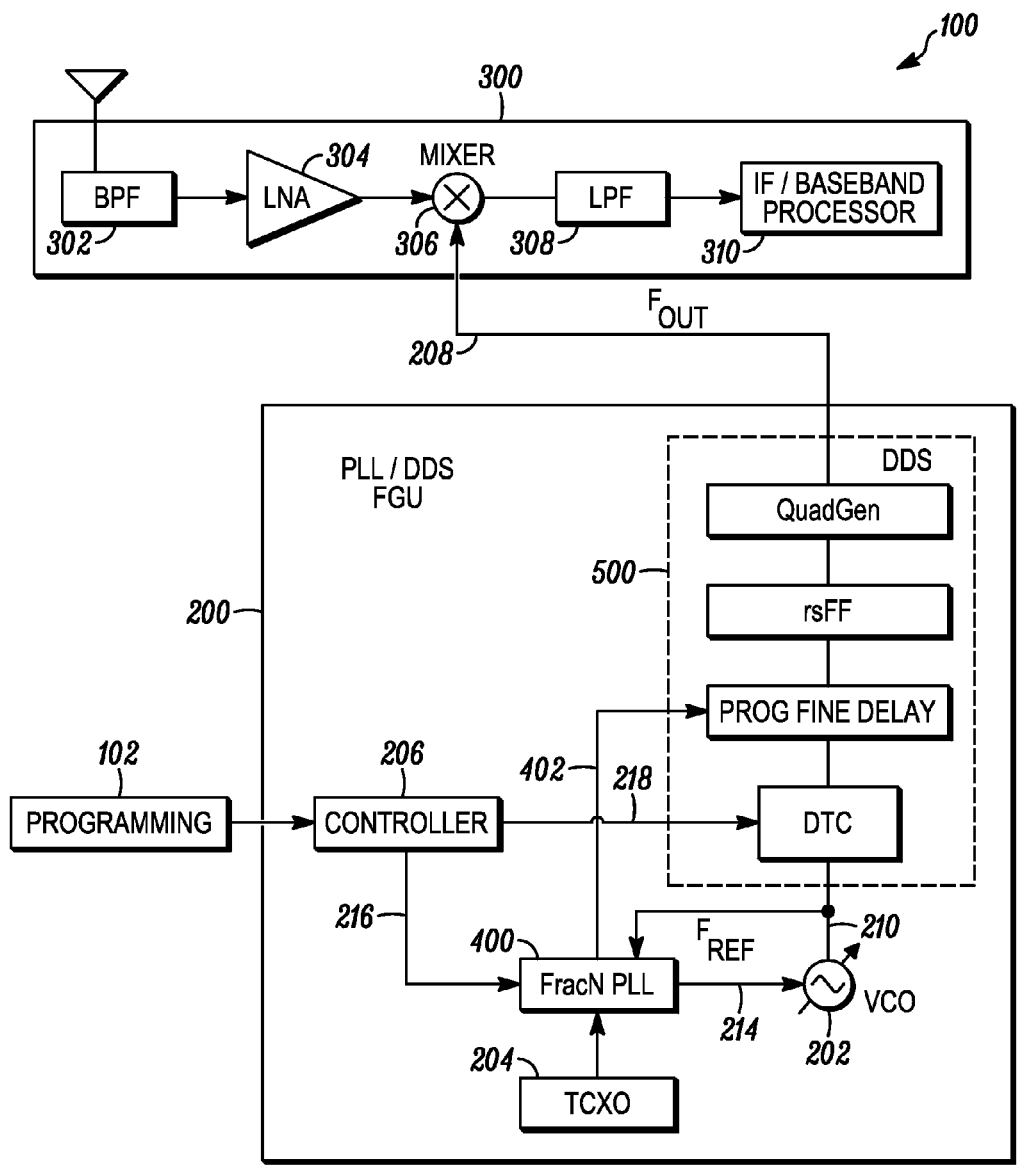
FIG. 1 depicts an embodiment of a block schematic representation of an electronic device having a frequency generation unit connected with a frequency receiving unit.
Figure 2:
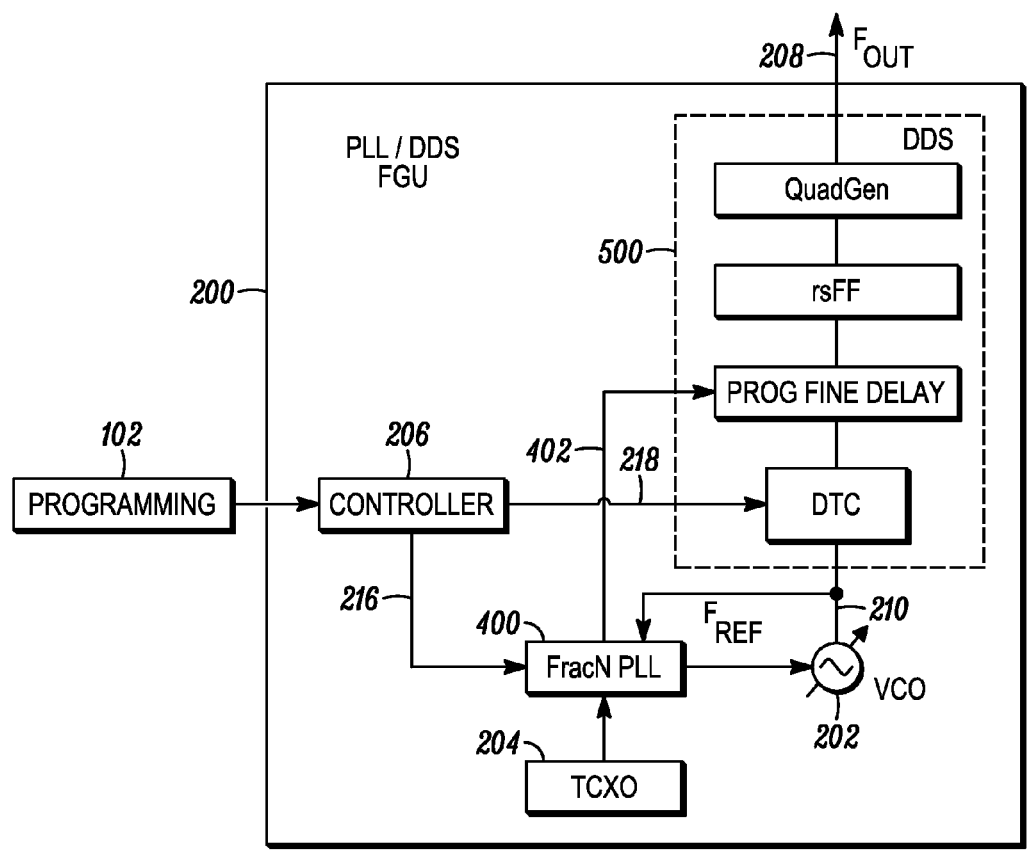
FIG. 2 depicts an embodiment of a block schematic representation of the frequency generation unit having a fractional-N synthesizer and a direct digital synthesizer.

With reference to FIGS. 1 and 2, depicted is an electronic device 100 having a frequency generation unit 200 connected with a frequency receiving unit 300. Frequency receiving unit 300 may be any device which receives a signal. In one embodiment, frequency receiving unit 300 includes a band pass filter 302 connected with a low noise amplifier 304 and an antenna (not labeled), a mixer 306, a low pass filter 308, and a IF/baseband processor 310. Low noise amplifier 304 is connected with a mixer 306 which is also connected with frequency generation unit 200 and receives an output signal 208 output from the frequency generation unit 200. Mixer 306 is connected with low pass filter 308, and low pass filter 308 is connected with the IF/baseband processor 310.

The electronic device 100 is any device which receives, transmits, or processes signals having multiple frequencies, and includes devices such as: a receiver; a transmitter; a transceiver; a radio; a cordless phone; a cellular phone; a television; a computer; a laptop; a software defined radio; and a piece of networking equipment such as a router, a switch or a modem. As depicted in FIG. 1, in one embodiment, electronic device 100 is a programmable receiver system.

Electronic device 100 receives a programming value 102 which determines a preprogrammed output frequency ($F_{out\,pp}$) at which output signal 208 output from the frequency generation unit 200 is to be output. Preferably, the actual frequency ($F_{out}$) of output signal 208 is within 0.1%, and more preferably, within 0.01% and most preferably within 0.001% of the value of the preprogrammed output frequency ($F_{out\,pp}$) in the programming value 102.

With reference to FIGS. 1 and 2, the frequency generation unit 200 includes a controller 206, a fractional-N synthesizer 400, a voltage controlled oscillator 202, a temperature controlled crystal oscillator (TCXO) 204 and a direct digital synthesizer 500. The controller 206 receives the programming value 102 and is connected with the fractional-N synthesizer 400 and the direct digital synthesizer 500. Upon receiving the programming value 102, controller 206 generates and transmits a control signal 216 to the fractional-N synthesizer 400 and another control signal 218 to the direct digital synthesizer 500. The control signals 216, 218 control the fractional-N synthesizer 400 and the direct digital synthesizer 500, respectively, based on the preprogrammed output frequency ($F_{out\,pp}$) of the output signal 208.

The preprogrammed output frequency ($F_{out\,pp}$) defines a reference frequency ($F_{ref}$) for the reference signal 210 input into the direct digital synthesizer 500. The control signals 216 and 218 are a function of the output frequency ($F_{out}$) of the output signal 208 which is expected to be equal to the preprogrammed frequency ($F_{out\,pp}$) during steady state operation of the frequency generation unit 200 once any frequency transition has been completed. The frequency value of the reference frequency ($F_{ref}$) is determined using the flow diagram shown in FIG. 6, finding a value between $F_{max}$ and $F_{min}$ satisfying an integer value for L, where $F_{max}$ and $F_{min}$ are the maximum and minimum frequency values for the reference frequency ($F_{ref}$) set by the VCO.

Control signals 216, 218 are sequenced to increment the transition in the output frequency ($F_{out}$) of the output signal 208 from a first frequency to a second frequency in a controlled manner to maintain signal quality of the output signal and to maintain operation frequency of the output frequency ($F_{out}$) in a perpetually locked condition (after initial startup, of course). A locked condition is defined herein as a condition where a period of the reference signal 210 generated by voltage controlled oscillator 202 is within an acceptable range (e.g., within about 1%) of a previous cycle period value, that is there is no appreciable cycle skipping between the VCO 202 and TCXO 204. LME Cycle skipping is between the output of divider 410 (shown in FIG. 4) and the signal 212 generated by TCXO 204. These two signals will normally be in phase with a near zero degree offset error. Cycle skipping occurs if the phase difference between the two signals shifts a cycle or more and never returns to the original cycle. Preferably, the combination of the voltage controlled oscillator and the fractional-N synthesizer remains perpetually locked and the output frequency ($F_{out}$) is maintained in an always locked condition.

Figure 3:
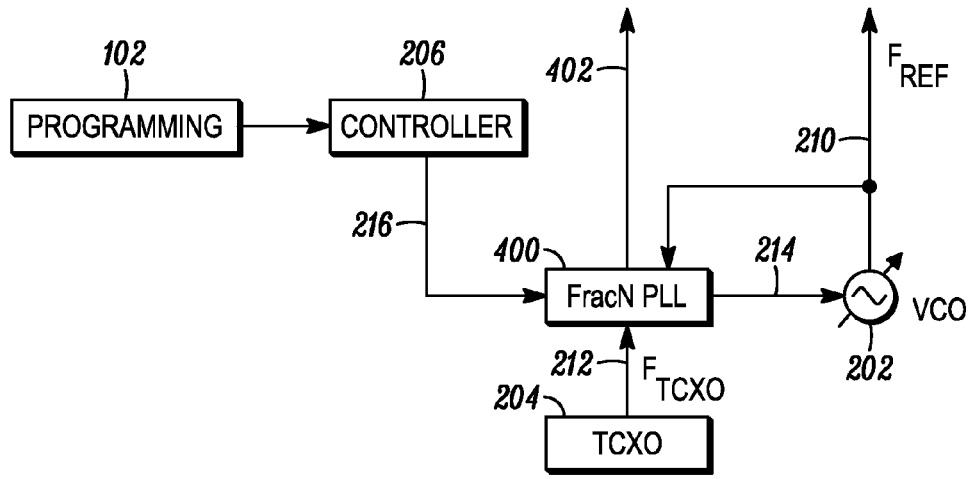
FIG. 3 depicts an embodiment of a block schematic representation of a portion of the frequency generation unit.

With reference to FIGS. 1, 2, and 3, the fractional-N synthesizer 400 is connected with the controller 206, the voltage controlled oscillator 202, and the direct digital synthesizer 500. The fractional-N synthesizer 400 receives the control signal 216 from the controller 206 having the preprogrammed output frequency ($F_{out\,pp}$) for output signal 208. Upon receiving the control signal 216, the fractional-N synthesizer 400 then generates and transmits control signals 214 and 402 to the voltage controlled oscillator 202 and the direct digital synthesizer 500, respectively, for adjusting parameters within both the voltage controlled oscillator 202 and the direct digital synthesizer 500. The fractional-N synthesizer 400 uses a feedback error control signal 214 to adjust a reference frequency ($F_{ref}$) of a reference signal 210 generated by voltage controlled oscillator 202. Preferably, the fractional-N synthesizer 400 uses the control signal 214 to vary the frequency ($F_{ref}$) of the reference signal 210 between one of two frequencies, in order to generate an output signal ($F_{out}$) 208 having a frequency which is at a predetermined percentage of the reference signal 210 frequency. This causes ratio of the output value of the direct digital synthesizer 500 to the input value of the direct digital synthesizer 500 to be an integer (an output signal 208/the reference signal 210). This is to say that that the ratio of N*reference signal 210/output signal 208 is an integer value, where N is the oversampling ratio, if any, in the direct digital synthesizer 500. For example, if reference signal 210 is 16 GHz and output signal 208 is 1 GHz, the ratio is an integer value of 16. So 16 GHz/15 or 16 GHz/17 would be valid frequencies. If the direct digital synthesizer 500 was oversampled by 2, then the ratio would be 1/32 and the output would be 32 GHz/32=1 GHz. However, the steps could now be 32 GHz/31 or 32 GHz/33 or ½ the resolution without the oversampling.

The fractional-N synthesizer 400 controls and adjusts the frequency ($F_{ref}$) of the reference signal 210 generated by the voltage controlled oscillator 202 and controls and tunes at least one parameter of the direct digital synthesizer 500, accordingly, using information received in the control signal 216. The direct digital synthesizer 500 is clocked at the rate of the frequency ($F_{ref}$) of the reference signal 210 to provide a synthesized output signal 208 at a frequency ($F_{out}$) with a period that is an integer fraction of the period of reference signal 210.

It has been discovered that there exists a phase offset in the fractional-N synthesizer 400 which is dependent on the slew rate of the fractional-N synthesizer 400. The phase offset goes from zero degrees, or a fixed offset of degrees, to some finite additional offset number and back again to zero degrees, or the original offset degrees, during the tuning process, provided the slew rate of the fractional-N synthesizer 400 is forced to be at a continuous rate. The phase offset in the fractional-N synthesizer 400 results in a phase rotation of the output signal 208 equal to the ratio of the frequency of 208 divided by the frequency of 212 multiplied by the phase offset in the fractional-N synthesizer 400. Since it is possible that a changing phase rotation of the output signal 208 could cause spurious interference to be present in the output signal 208 and to present itself in the frequency receiving unit 300, the phase of the direct digital synthesizer 500 is adjusted, e.g., by a separate control that phase modulates the direct digital synthesizer 500.

As a result, in one embodiment, the fractional-N synthesizer 400 controls and tunes the frequency generation unit 200, and in particular tunes itself, the fractional-N synthesizer 400, and the direct digital synthesizer 500, by adjusting at least one parameter in each of the fractional-N synthesizer 400 and the direct digital synthesizer 500. Preferably, a first parameter of the direct digital synthesizer 500 and a second parameter of the fractional-N synthesizer 400 are adjusted simultaneously so that the frequency ($F_{out}$) of the output signal 208 is generally constant. As used herein, generally constant means that the frequency varies no more than ±1%, and preferably, no more than ±0.01%, and preferably no more than ±0.001%, from the preprogrammed output frequency ($F_{out\,pp}$) for the output signal 208. Preferably, the first parameter is a divide number or programmable delay value of the direct digital synthesizer 500 and the second parameter is a divide number or programmable delay value of the fractional-N synthesizer 400. By tuning or adjusting a first parameter of the direct digital synthesizer 500 and a second parameter of the fractional-N synthesizer 400, preferably simultaneously, the frequency ($F_{out}$) of the output signal 208 may remain generally constant. Additionally, tuning the first and second parameters, preferably simultaneously, allows the tuning to happen without unlocking the combination of the voltage controlled oscillator 202 and the fractional-N synthesizer 400 and eliminates most if not all phase rotation of the output signal 208 that would have resulted if no tuning was performed (the remaining phase rotation may be eliminated by the above phase control signal provided to the direct digital synthesizer 500). Retaining the lock insures the output signal has a deterministic signal quality in both time and frequency that is suitable for continuous frequency translation functionality associated with transceiver applications.

Figure 4:
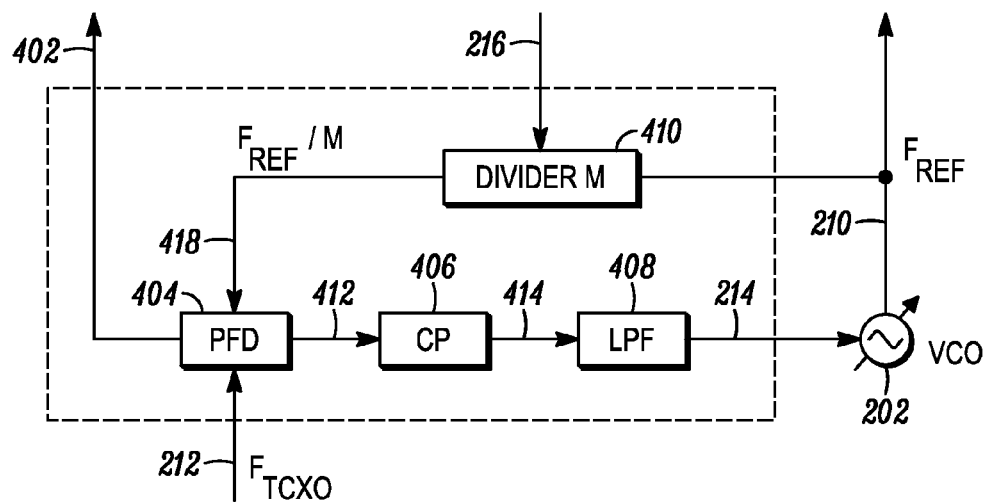
FIG. 4 depicts an embodiment of a block schematic representation of the fractional-N synthesizer connected with a voltage controlled oscillator.

With reference to FIG. 4, fractional-N synthesizer 400 is shown having a divider M 410, a phase frequency detector (PFD) 404, a charge pump 406, and a low pass filter 408. Fractional-N synthesizer 400 provides the feedback error control signal 214 to the voltage controlled oscillator 202, so that the voltage controlled oscillator 202 may match the accuracy of the frequency ($F_{ref}$) of the reference signal 210 to that of the frequency ($F_{TCXO}$) of the signal 212 generated by the temperature controlled crystal oscillator (TCXO) 204. The desired reference frequency ($F_{ref}$) for reference signal 210 is a function of the preprogrammed output frequency ($F_{out\,pp}$) in the programming value 102 determined by controller 206 and then sent as signal 216 to divider M 410, which generates a signal 418. Signal 418 is expected to have an average period equal to that of $F_{TCXO}$ when the reference signal 210 has been adjusted to the preprogrammed frequency $F_{out\,pp}$.

Additionally, the frequency ($F_{TCXO}$) is equal to the reference frequency ($F_{ref}$) divided by some multiple, or divider value M ($F_{ref}/M=F_{TCXO}$). Whatever the value of M is, it is desirable for the direct digital synthesizer 500 to have an integer divide ratio to minimize spurs. Thus, steady state condition provides the direct digital synthesizer 500 at integer divide and the fractional-N synthesizer 400 is placed wherever necessary to accomplish this integer divide.

As shown in FIG. 4, signals 212 and 418 are compared by phase frequency detector (PFD) 404 which generates a resulting error output signal 412. The resulting error output signal 412 is then processed into charge up or down current pulses 414 by the charge pump (CP) 406. These pulses 414 are then low passed filtered by low pass filter (LPF) 408 to provide feedback error control signal 214.

A second error control signal 402 is provided to control the phase or time shift rate of change of the output signal 208. Error control signal 402 is a function of the instantaneous time difference between the signal 212 from the TCXO 204 and the signal 418 from the divider M 410. Error control signal 402 is used to program the phase or time shift of output signal 208 in order to reduce or increase the rate of change of output signal 208 during the transition to the preprogrammed output frequency ($F_{out\,pp}$) from the current output frequency ($F_{out\,current}$).

Figure 5:
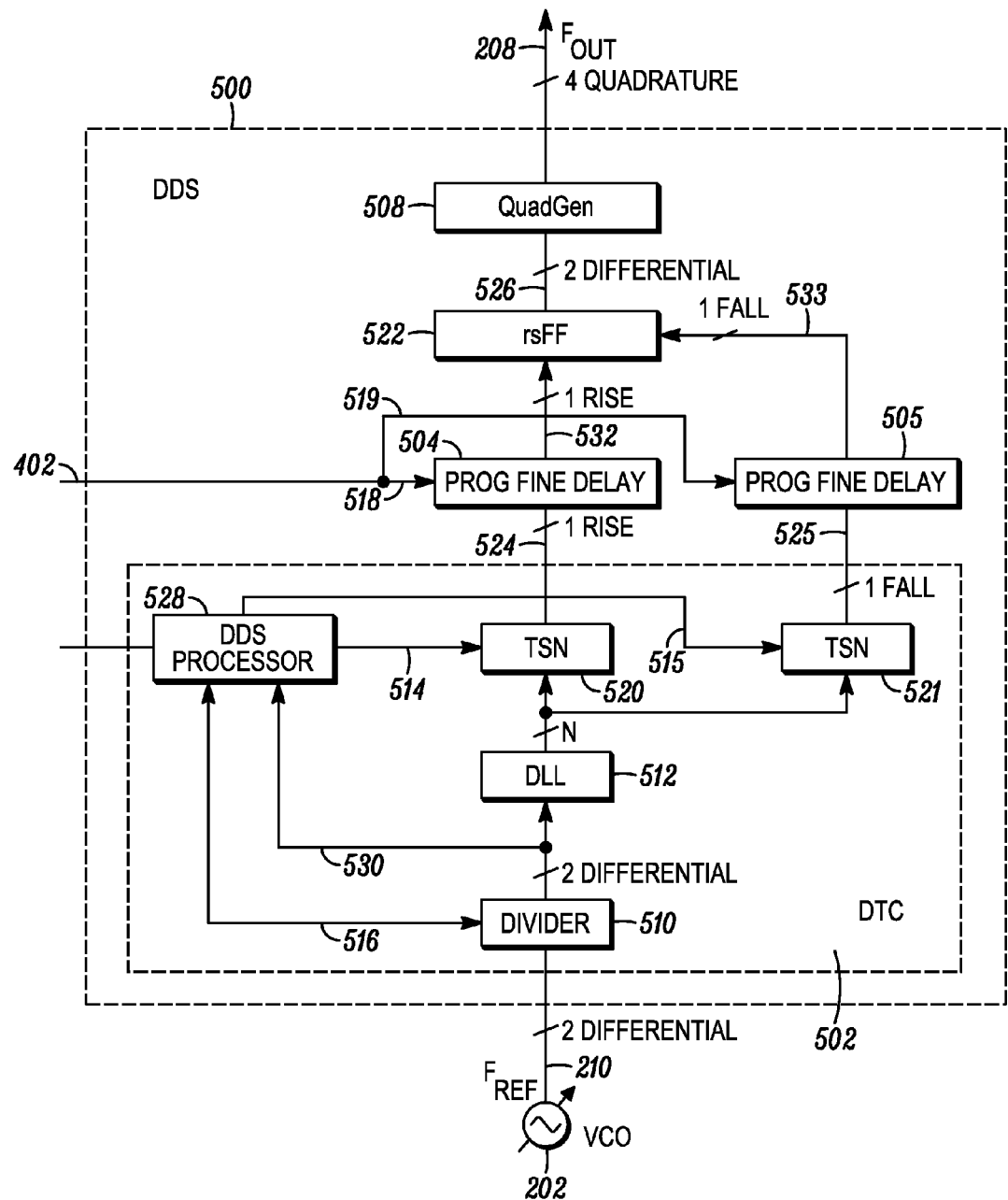
FIG. 5 depicts an embodiment of a block schematic representation of the direct digital synthesizer connected with the voltage controlled oscillator.

With reference to FIG. 5, direct digital synthesizer 500 is shown having a digital to time converter 502, a pair of programmable fine delays 504 and 505, a reset/set flip flop 522, and a quadrature generator 508. Direct digital synthesizer 500 provides a set of square wave output signals 208 at output frequency ($F_{out}$). The output signal 208 is a differential quadrature set of signals suitable for quadrature frequency translation such as with a switching mixer 306. The input reference signal 210 to the direct digital synthesizer 500 could be a differential or single-ended sinusoid or square wave at reference frequency ($F_{ref}$).

Digital to time converter 502 includes a divider 510, a delay lock loop 512, a pair of tap select networks 520, 521 and a direct digital synthesizer (DDS) processor 528. Upon entering direct digital synthesizer 500, reference signal 210 is processed by digital to time converter 502 into a set of two rising edge and falling edge signals 524, 525 defining the relative rising and falling edge time events of differential output signal 526. Reset/set flip flop (rsFF) 522 converts time delayed rising edge and falling edge signals 524, 525 into a differential output signal 526. The duty cycle of output signal 526 is defined by the time offset between the rising edge and falling edge signals 524, 525. The duty cycle is defined by DDS Processor 528, which is preferably between 10 and 90%, and most preferably 50%±5%, for standard switching mixer applications and 25%±2.5%, for sampling mixer applications. DDS Processor 528 is clocked by input signal 530, whose frequency is an integer divided value of reference frequency ($F_{ref}$). DDS Processor 528 can be programmed to provide direct digital phase modulation (DDPM) encoding on the rising edge and falling edge signals 524, 525. Finer resolution phase modulation or time shift events can also be encoded on rising edge and falling edge signals 524, 525 using programmable fine delays 504 and 505. Preferably, DDPM encoding is used in concert with frequency changes in the reference frequency ($F_{ref}$) of reference signal 210 in order to provide a controlled transition in the frequency ($F_{out}$) of output signal 208. The controlled transition provided by DDPM encoding is designed to maintain signal quality during rapid transition of the frequency ($F_{out}$) of output signal 208 within the continuous locked state of the fractional-N synthesizer 400.

Direct Digital Synthesizer 500 provides a set of square wave output signals 208 having output frequency ($F_{out}$). Output frequency ($F_{out}$) is a function of the reference frequency ($F_{ref}$) by $$F_{out} = N * F_{ref}/(P*I); \quad (1)$$

whereby I=an integer value 516 programmed into divider block 510, and whereby N=a number of unit delay steps designed into delay lock loop (DLL) 512.

Additionally, P=a number of unit delays 514 programmed into tap select network (TSN) 520 whereby $F_{out} = (N*F_{ref}(1)/(P*I))$ is a discrete set of frequencies that the direct digital synthesizer 500 can be programmed to relative to the reference frequency ($F_{ref}$) of reference signal 210 and the programmable values of I, having acceptable spurious free dynamic range for LMR equipment. In order to maintain acceptable spurious free performance and move the current output frequency ($F_{out\ current}$) of signal 208 to a new output frequency ($F_{out\ new}$), the current reference frequency ($F_{ref\ current}$) of reference signal 210 is moved to a new reference frequency ($F_{ref\ new}$) that will solve Equation (1) for the desired value of $F_{out} = (N*F_{ref}(2)/(P*I))$.

DDS Processor 528 uses a digital algorithm to control tap select networks 520 and 521 in order to provide rising edge and falling edge signals 524, 525 with a constant time delay period of P*I/N periods at the reference frequency ($F_{ref}$). Rising edge and falling edge signals 524, 525 are designed to have an offset that defines the duty cycle of the output signal 208, ideally to a value of 50%. Programmable fine delay blocks 504 and 505 provide a compensation for relative time offset errors between the rise and fall paths defining output frequency ($F_{out}$) rising and falling events. Fine delay blocks 504 and 505 can also be programmed to provide a phase or time shift encoding event on the output signal 208. The total amount of phase or time shift of the fine delay blocks 504 and 505 is equal to one time shift step capability of the tap select networks 520 and 521.

Figure 7:
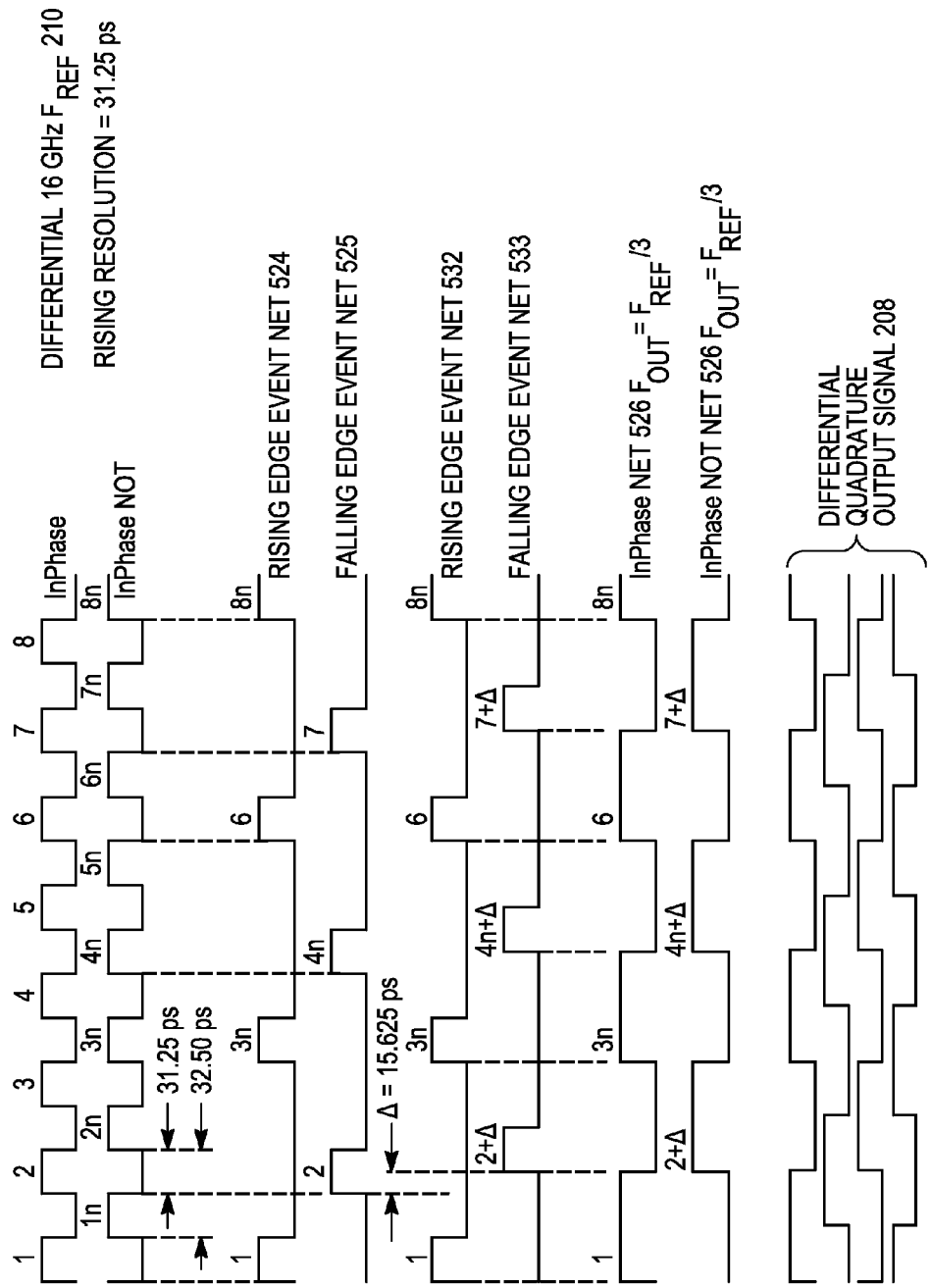
FIG. 7 depicts an embodiment of a series of sample signals generated by the direct digital synthesizer.

With reference to FIG. 7, signals 208, 524, 525, 526, 532, and 533 generated by direct digital synthesizer 500 are shown. Signals 208, 524, 525, 526, 532, and 533 represent signals shown for an example case wherein the output frequency ($F_{out}$) is equal to the reference frequency ($F_{ref}$) divided by 3 (N=I=1 and P=3). The example uses a reference frequency ($F_{ref}$) of 16 GHz. The tap select networks 520 and 521 are designed to provide selection of either differential signal associated with the reference frequency ($F_{ref}$). For an odd divider value, such as that of this example (i.e. a divider value of 3), a programmable delay offset Δ is employed between the rise and fall edge events of about 15.625 ps, assuming the reference frequency ($F_{ref}$) is 16 GHz or a period of 62.5 ps. The value of Δ is ideally half way between the rising edges of the 16 GHz differential reference signal 210. Using this value of Δ provides approximately a 50% duty cycle output signal 208.

Frequency generation unit 200 has the following benefits. First, the direct digital synthesizer 500 allows for the immediate transition from a current output frequency ($F_{out\ current}$) to a new output frequency ($F_{out\ new}$). Second, the fractional-N synthesizer 400 allows the direct digital synthesizer 500 to only operate at integer divide numbers when the voltage controlled oscillator 202 is operating at a long term resting frequency or steady state mode. This reduces any spurious content which potentially could be generated by the direct digital synthesizer 500 to be the same as that generated by the fractional-N synthesizer 400. Third, since both the fractional-N synthesizer 400 and the direct digital synthesizer 500 can operate at fractional frequencies they both can be adjusted such that the transition from a current output frequency ($F_{out\ current}$) to a new output frequency ($F_{out\ new}$) is nearly instantaneous for the output frequency ($F_{out}$) but more gradual within the Fractional-N synthesizer 400.

When tuning a phase-locked loop (PLL) synthesizer comprising a direct digital synthesizer (DDS) and a Fractional-N synthesizer there exists a phase offset error in the Fractional-N synthesizer which is dependent on the slew rate of the Fractional-N synthesizer. The phase offset error results in a phase transition which goes from zero degrees to some finite number and back to zero degrees. The phase transition in the Fractional-N synthesizer then results in a phase rotation at output of the DDS. It is possible that this rotation in phase could cause a spurious output at a transmitter power amplifier or a receiver detector.

It would be desirable to allow the tuning of the PLL synthesizer to happen without unlocking the phase-locked loop within the PLL synthesizer and to eliminate the phase offset error that results. It would also be desirable to have a PLL synthesizer with virtually instantaneous frequency changes in the frequency of an output signal generated by the PLL synthesizer, while maintaining very low spurious content in the output signal for signals that rest on a frequency for a length of time.

As a result, in order to eliminate or reduce frequency errors that may occur when changing the frequency ($F_{out}$) of output signal 208 from a first frequency ($F_{out1}$) to a second frequency ($F_{out2}$), the frequency generation unit 200 sends feedback error control signal 214 from fractional-N synthesizer 400 to voltage controlled oscillator 202. The feedback error control signal 214 adjusts the frequency ($F_{ref}$) of a reference signal 210 generated by the voltage controlled oscillator 202. Then, the frequency generation unit 200 generates output signal 208 at the second frequency ($F_{out2}$) from the reference signal 210 using direct digital synthesizer 500.

Preferably, a first parameter of the direct digital synthesizer 500 and a second parameter of the fractional-N synthesizer 400 are adjusted simultaneously so that the second frequency ($F_{out2}$) is kept generally constant. In one embodiment, the first parameter is an internal variable steady state divider L of the direct digital synthesizer 500 and the second parameter is an internal variable steady state divider M of the fractional-N synthesizer 400.

Preferably, a slew rate of the fractional-N synthesizer 400 is controlled to maintain the fractional-N synthesizer 400 in a phase locked state. In one embodiment, the frequency generation unit 200 determines any slew rate offset phase generated by the fractional-N synthesizer 400 and then corrects for any slew rate offset phase generated by the fractional-N synthesizer 400 in the direct digital synthesizer 500 in order to cancel any phase offset in the output signal 208.

Preferably, the feedback error control signal 214 adjusts the frequency ($F_{ref}$) of the reference signal 210 by varying the frequency ($F_{ref}$) of the reference signal 210 between one of two frequencies.

In one embodiment, the frequency generation unit 200 generates additional control signals 216 and 218 via controller 206, wherein the additional control signals sequentially inform both the fractional-N synthesizer 400 and the direct digital synthesizer 500 of the second frequency ($F_{out2}$) of the output signal 208. In this manner, the fractional-N synthesizer 400 and the direct digital synthesizer 500 can simultaneously tune to the new output frequency ($F_{out2}$).

Figure 6:
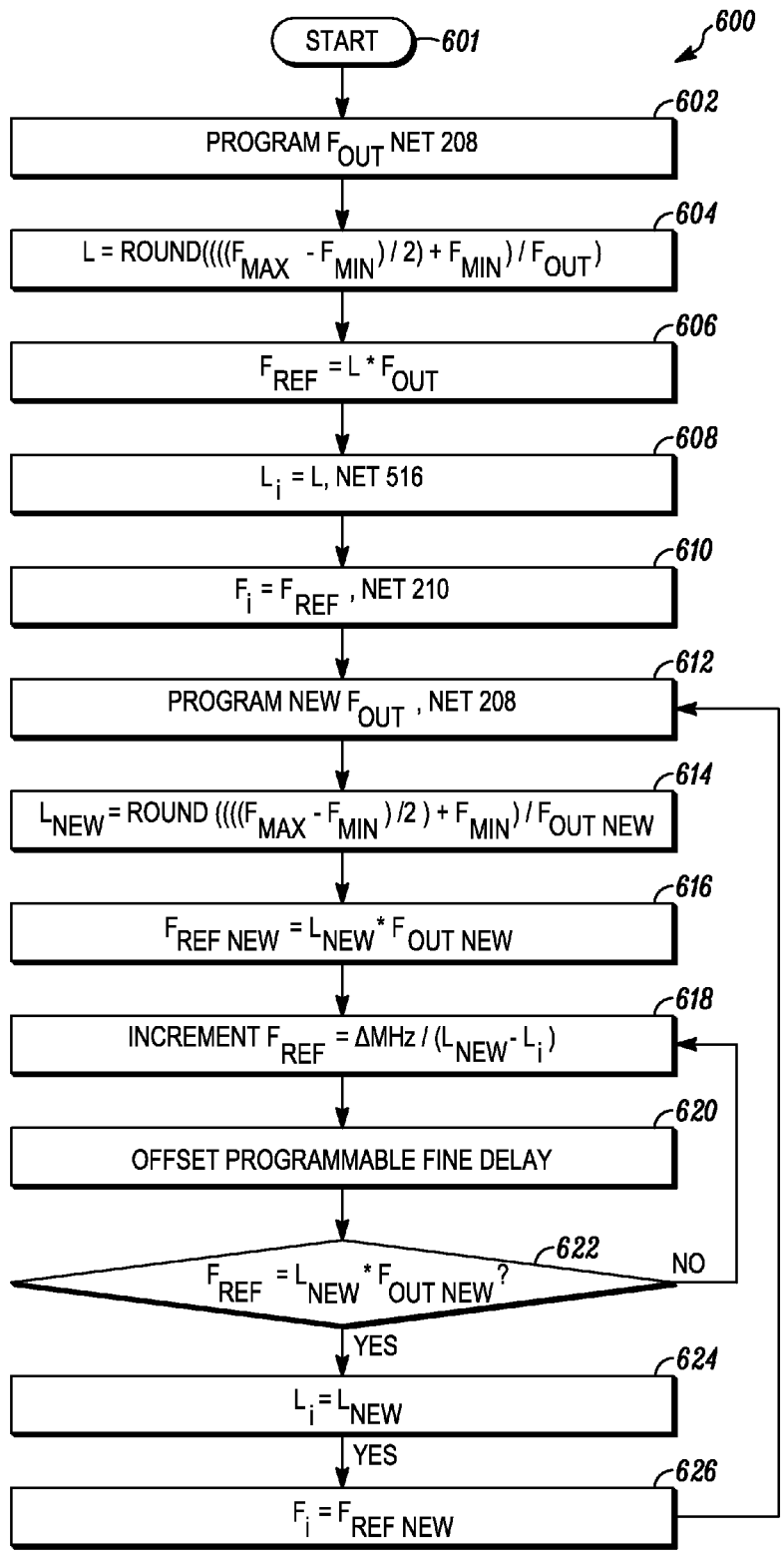
FIG. 6 is an embodiment of a flowchart illustration of methods, apparatus (systems) and computer program products.

FIG. 6 provides a method 600 for operation of the frequency generation unit 200. At block 601, the method 600 is initiated with a start operation. At block 602, the frequency generation unit 200 receives a programming value 102, which includes a desired frequency ($F_{desired}$) for the output frequency ($F_{out}$) of the output signal 208. Then internal variable L is calculated at step 604 and the reference frequency ($F_{ref}$) the reference signal 210 is calculated at step 606. Moving to steps 608 and 610, while operating at steady state, the direct digital synthesizer 500 and fractional-N synthesizer 400 set their internal variable initial (i) steady state dividers at $L_i$=L and initial (i) steady state frequency $F_i$=$F_{ref}$. The reference frequency ($F_{ref}$) is a function of the desired output frequency $F_{desired}$=$F_{ref}$/L. Moving to step 612, when a new output frequency ($F_{out\ new}$) for output signal 208 is desired, that frequency ($F_{out\ new}$) is programmed into the frequency generation unit 200 via a new programming value 102. Then, a new internal variable $L_{new}$ is calculated at step 614 and a new reference frequency ($F_{ref new}$) is calculated at step 616. At step 618, the fractional-N synthesizer 400 increments the reference $F_{ref}$, in frequency steps between the steady state frequency $F_i$ and the new reference frequency ($F_{ref new}$) equal to the new desired output frequency $F_{out\ new}$/$L_{new}$. At step 620, a programmable fine delay 504 and 505 is offset during the transition between $F_i$ and $F_{outnew}$. At step 622, the frequency generation unit 200 then determines if $F_{ref}$ is equal to the new internal variable $L_{new}$ multiplied by the new desired output frequency $F_{new\ out}$. If not, then the method 600 moves back to step 618, if so, the method 600 moves to steps 624 and 626. At steps 624 and 626, once the new $F_{ref}$ frequency is equal to that of the new desired output frequency $F_{new\ out}$*$L_{new}$, or equal to the new reference frequency ($F_{ref new}$), steady state variables $L_i$ and $F_i$ are updated within the controller 206 of frequency generation unit 200. The incremental frequency steps of the fractional-N synthesizer 400 are designed to keep the fractional-N synthesizer 400 locked and provide an output signal 208 with a generally constant output frequency ($F_{out}$) having a signal quality meeting LMR equipment signal quality performance requirements.

As a result, by using a frequency generation unit having both a fractional-N synthesizer and a direct digital synthesizer, both tied to each other and to a single voltage controlled oscillator, an output signal 208 may be provided which has a generally constant output frequency ($F_{out}$) and a signal quality meeting LMR equipment signal quality performance requirements.

In previous embodiments, the voltage controlled oscillator is controlled by a fractional-N synthesizer whose output signal $F_{ref}$ is connected as the input to the direct digital synthesizer. This, in essence, is a closed loop fractional-N synthesizer phase lock loop supplying a signal to a direct digital synthesizer which is operating in an open loop mode. In an alternate embodiment, the voltage controlled oscillator is again connected to the direct digital synthesizer and the output of the direct digital synthesizer $F_{out}$ is again connected to a frequency receiving unit. The input of the fractional-N synthesizer (the signal into divider M) in this embodiment, however, rather than being $F_{ref}$ is the output of the direct digital synthesizer $F_{out}$. Thus, the signal of the voltage controlled oscillator is divided first by the direct digital synthesizer to supply the output signal to frequency receiving unit and then by the fractional-N synthesizer to make the frequency of the signal from divider M the same as that of the temperature controlled crystal oscillator. In this embodiment, both the fractional-N synthesizer and the direct digital synthesizer are enclosed in the feedback loop.

In one example of this embodiment, if the voltage controlled oscillator $F_{ref}$ is at 16 GHz and the operating output frequency of the direct digital synthesizer is 1 GHz, then the direct digital synthesizer has an integer divide of 16. If the temperature controlled crystal oscillator is at 50 MHz, divider M is set at 20 to divide the 1 GHz signal to 50 MHz. If it is desired to change to a new output frequency of 990 MHz, the direct digital synthesizer switches its divide frequency to 16 GHz/990 MHz=~16.2. Divider M switches its divide number M to 990 MHz/50 MHz=~19.8. This allows an instantaneous frequency change at $F_{out}$ and a stable total loop where the inputs to the phase frequency detector remain the same. However, the direct digital synthesizer is not at an integer divide which is optimum for spurious performance. The closest integer divide number for the direct digital synthesizer is 16. The voltage controlled oscillator thus moves from 16 GHz to {990 MHz*16}=15.84 GHz for optimum performance. Since the output frequency of the direct digital synthesizer remains at 990 MHz, the divide number M of the fractional-N synthesizer doesn't change as the voltage controlled oscillator is slewed from 16 GHz to 15.84 GHz. This is slightly different than the previous embodiment where the divide numbers of both the direct digital synthesizer and the fractional-N synthesizer are slewed.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.)

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into comprehensive devices and/or processes and/or systems via a reasonable amount of experimentation. Those having skill in the art will recognize that examples of such comprehensive devices and/or processes and/or systems might include—as appropriate to context and application—all or part of devices and/or processes and/or systems of (a) an air conveyance (e.g., an airplane, rocket, hovercraft, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Quest, Southwestern Bell, etc.); or (g) a wired/wireless services entity such as Sprint, Cingular, Nextel, etc.), etc.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. Accordingly, the invention is not to be restricted except in light of the appended claims and their equivalents.

The invention claimed is:

1. A frequency generation unit comprising:
a fractional-N synthesizer;
a direct digital synthesizer connected with an output of the fractional-N synthesizer such that an output from the direct digital synthesizer forms an output signal of the frequency generation unit, the fractional-N synthesizer maintained in a locked state when the output is generated;
a voltage controlled oscillator generating a reference signal, which is supplied to one of the direct digital synthesizer or the fractional-N synthesizer such that the combination of the voltage controlled oscillator and the fractional-N synthesizer is perpetually locked; and
a controller connected with the fractional-N synthesizer and the direct digital synthesizer, the controller generating a first control signal that indicates to both the fractional-N synthesizer and the direct digital synthesizer of a desired frequency of the output signal.

2. The device of claim 1, wherein the reference signal is supplied to the direct digital synthesizer.

3. The device of claim 1, wherein the fractional-N synthesizer supplies a second control signal to the voltage controlled oscillator, and the voltage controlled oscillator supplies the reference signal to the direct digital synthesizer in response to the second control signal.

4. The device of claim 3, wherein the fractional-N synthesizer adjusts the frequency of the reference signal sent to the direct digital synthesizer via the second control signal.

5. The device of claim 3, wherein the fractional-N synthesizer adjusts the frequency of the reference signal sent to the direct digital synthesizer via the second control signal, the fractional-N synthesizer is connected with the direct digital synthesizer for supplying a third control signal to the direct digital synthesizer, and the third control signal is for varying a divide number of the direct digital synthesizer.

6. The device of claim 1, wherein an output of the voltage controlled oscillator is processed and then compared to a temperature controlled oscillator signal.

7. The device of claim 1, wherein the fractional-N synthesizer uses the first control signal to vary the frequency of the reference signal between a plurality of frequencies, allowing the direct digital synthesizer to generate an output synthesized signal whose frequency ratio to that of the reference signal is an integer.

8. The device of claim 1, wherein the fractional-N synthesizer is connected with the direct digital synthesizer for supplying a third control signal to the direct digital synthesizer, and the third control signal is for varying a programmable delay value of the direct digital synthesizer.

9. A method for generating an output signal, the method comprising:
sending a first control signal from a fractional-N synthesizer to one of a voltage controlled oscillator or a direct digital synthesizer such that the combination of the voltage controlled oscillator and the fractional-N synthesizer is perpetually locked;
generating a reference signal using the voltage controlled oscillator, the first control signal adjusting the frequency of the reference signal;
receiving the reference signal at the direct digital synthesizer; and
transmitting a second control signal from the fractional-N synthesizer to the direct digital synthesizer whereby the direct digital synthesizer generates the output signal.

10. The method of claim 9, wherein the first control signal adjusts the frequency of the reference signal by varying the frequency of the reference signal between one of two frequencies.

11. The method of claim 9 wherein the second control signal varies a divide number of the direct digital synthesizer.

12. The method of claim 9, wherein the first control signal is sent upon receiving the reference signal.

13. The method of claim 9 further comprising generating a third control signal from a controller, the third control signal informing both the fractional-N synthesizer and the direct digital synthesizer of a desired frequency of the output signal.

14. A method for changing a frequency of an output signal from a first frequency to a second frequency, the method comprising:
sending a first control signal from a fractional-N synthesizer to one of a voltage controlled oscillator or a direct digital synthesizer such that the combination of the voltage controlled oscillator and the fractional-N synthesizer is perpetually locked, the first control signal adjusting a frequency of a reference signal generated by the voltage controlled oscillator; and
generating the output signal at the second frequency from the reference signal using the direct digital synthesizer.

15. The method of claim 14, wherein a first parameter of the direct digital synthesizer and a second parameter of the fractional-N synthesizer are adjusted simultaneously so that the second frequency is generally constant.

16. The method of claim 15, wherein the first parameter is a divide number of the direct digital synthesizer and the second parameter is a divide number of the fractional-N synthesizer.

17. The method of claim 14, wherein a slew rate of the fractional-N synthesizer is controlled to maintain the fractional-N synthesizer in a locked state.

18. The method of claim 14, further comprising determining a slew rate offset phase generated by the fractional-N synthesizer and correcting for the slew rate offset phase generated by the fractional-N synthesizer in the direct digital synthesizer in order to cancel a phase offset in the output signal.

19. The method of claim 14, wherein the first control signal adjusts the frequency of the reference signal by varying the frequency of the reference signal between one of two frequencies.

20. The method of claim 14 further comprising generating a second control signal from a controller, wherein the second control signal sequentially informs both the fractional-N synthesizer and the direct digital synthesizer of the frequency of the output signal.

* * * * *

UNITED STATES PATENT AND TRADEMARK OFFICE
CERTIFICATE OF CORRECTION

| | | |
|---|---|---|
| PATENT NO. | : 8,154,329 B2 | Page 1 of 1 |
| APPLICATION NO. | : 12/650649 | |
| DATED | : April 10, 2012 | |
| INVENTOR(S) | : Ecklund et al. | |

It is certified that error appears in the above-identified patent and that said Letters Patent is hereby corrected as shown below:

In Column 7, Line 22, delete "($F_{ret}$)" and insert -- ($F_{ref}$) --, therefor.

Signed and Sealed this
Eighth Day of January, 2013

David J. Kappos
*Director of the United States Patent and Trademark Office*